United States Patent
Nikitin et al.

(10) Patent No.: US 9,530,752 B2
(45) Date of Patent: Dec. 27, 2016

(54) METHOD FOR FORMING ELECTRONIC COMPONENTS

(71) Applicant: Infineon Technologies AG, Neubiberg (DE)

(72) Inventors: Ivan Nikitin, Regensburg (DE); Petteri Palm, Regensburg (DE); Joachim Mahler, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 282 days.

(21) Appl. No.: 14/076,976

(22) Filed: Nov. 11, 2013

(65) Prior Publication Data

US 2015/0131247 A1 May 14, 2015

(51) Int. Cl.
*H05K 13/02* (2006.01)
*H01L 23/00* (2006.01)

(52) U.S. Cl.
CPC ............... *H01L 24/97* (2013.01); *H01L 24/24* (2013.01); *H01L 2924/12042* (2013.01); *H01L 2924/13055* (2013.01); *H01L 2924/13091* (2013.01); *Y10T 29/4913* (2015.01)

(58) Field of Classification Search
CPC ............. B29C 45/14; B29C 2045/0086; B29C 2045/14114; H01L 21/56; H01L 21/563; H01L 21/568; H01L 24/24; H01L 24/97; H01L 2924/00; H01L 2924/12042; H01L 2924/13055; H01L 2924/13091; Y10T 29/4913; H05K 13/003
See application file for complete search history.

(56) References Cited

U.S. PATENT DOCUMENTS

| | | | | |
|---|---|---|---|---|
| 6,117,382 A | * | 9/2000 | Thummel | B29C 45/14655 264/272.14 |
| 6,173,490 B1 | * | 1/2001 | Lee | B29C 39/10 264/272.17 |
| 6,344,162 B1 | * | 2/2002 | Miyajima | B29C 43/18 264/272.17 |
| 6,511,620 B1 | * | 1/2003 | Kawahara | B29C 33/0055 264/40.5 |
| 6,544,816 B1 | * | 4/2003 | Lim | H01L 21/565 257/685 |
| 6,743,389 B2 | * | 6/2004 | Miyajima | B29C 43/36 264/272.17 |

(Continued)

FOREIGN PATENT DOCUMENTS

DE    10 2009 012 524    10/2009

OTHER PUBLICATIONS

Courtesy Mar. 20, 2015 examination report for corresponding German application 10 2014 115 653.6 and English language summary.

*Primary Examiner* — Carl Arbes

(57) ABSTRACT

A method which comprises arranging a plurality of electronic chips in a plurality of chip accommodation cavities each defined by a respective surface portion of a substrate and a wall delimited by a respective one of a plurality of holes in an electrically conductive frame arranged on the substrate, at least partially encapsulating the electronic chips in the chip accommodation cavities by an encapsulant, and forming electrically conductive contacts for electrically contacting the at least partially encapsulated electronic chips.

26 Claims, 3 Drawing Sheets

(56) References Cited

U.S. PATENT DOCUMENTS

| | | | |
|---|---|---|---|
| 7,126,216 B2 * | 10/2006 | Silverbrook | B29C 43/36 257/666 |
| 7,955,954 B2 | 6/2011 | Landau et al. | |
| 7,971,351 B2 * | 7/2011 | Takahashi | H01L 21/561 264/272.14 |
| 8,011,917 B2 * | 9/2011 | Hao | B29C 33/68 425/125 |
| 8,048,358 B2 * | 11/2011 | Takano | H01L 21/565 264/272.17 |
| 8,097,959 B2 | 1/2012 | Landau et al. | |
| 2012/0199971 A1 | 8/2012 | Shim et al. | |
| 2013/0249069 A1 | 9/2013 | Hosseini et al. | |

* cited by examiner

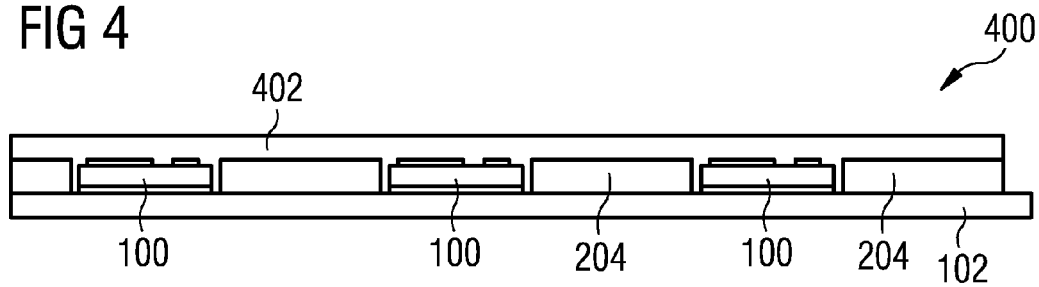
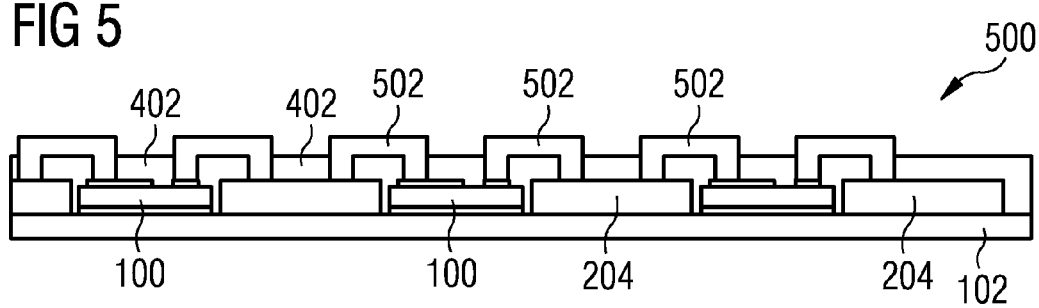
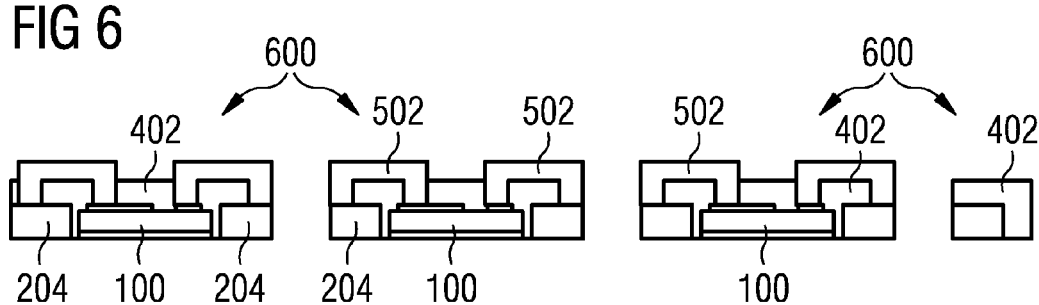

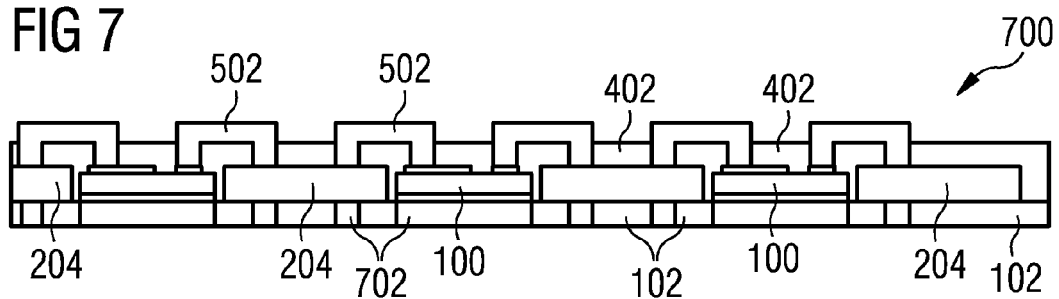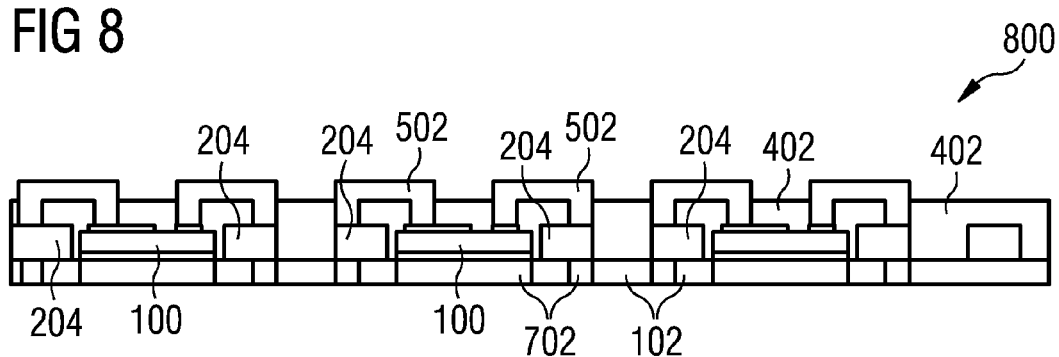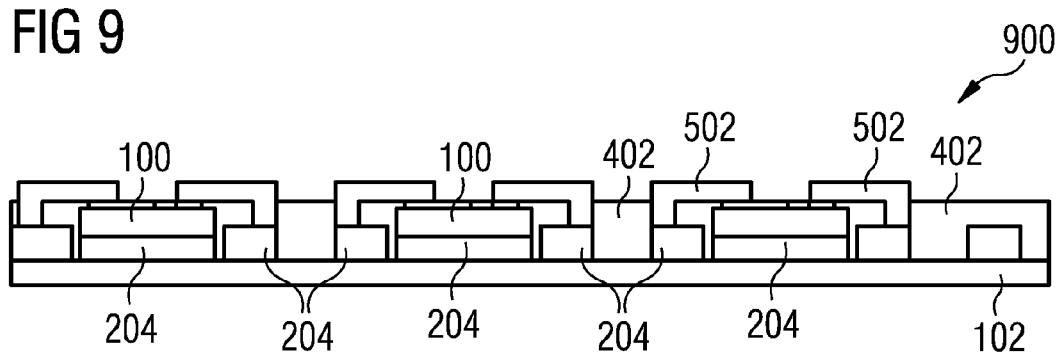

METHOD FOR FORMING ELECTRONIC COMPONENTS

BACKGROUND

Technical Field

Various embodiments relate generally to methods, an arrangement and an electronic component.

Description of the Related Art

Conventional packages, such as mold structures, for electronic chips have evolved to a level where the package no longer significantly impedes the performance of the electronic chips. Packaged electronic chips usually comprise a bond wire connecting an upper surface of the electronic chip with a leadframe or the like. A lower surface of the electronic chip is conventionally soldered onto the leadframe which involves high temperatures and a high mechanical stress.

SUMMARY

There may be a need to provide a possibility to package electronic chips with a simple processing architecture and with a high reliability.

According to an exemplary embodiment, a method is provided which comprises arranging a plurality of electronic chips in a plurality of chip accommodation cavities each defined by a respective surface portion of a substrate and a wall delimited by a respective one of a plurality of holes in an electrically conductive frame arranged on the substrate, at least partially encapsulating the electronic chips in the chip accommodation cavities by an encapsulant, and forming electrically conductive contacts for electrically contacting the at least partially encapsulated electronic chips.

According to another exemplary embodiment, a method is provided which comprises arranging a plurality of semiconductor power chips in a plurality of chip accommodation cavities each defined by a respective surface portion of a substrate and a wall delimited by a respective one of a plurality of through-holes in an electrically conductive frame arranged on the substrate, at least partially encapsulating the semiconductor power chips in the chip accommodation cavities and the electrically conductive frame by an encapsulant, forming first electrically conductive vias in the encapsulant for electrically contacting a respective main surface of the semiconductor power chips, and forming second electrically conductive vias in the encapsulant for electrically contacting respective portions of the electrically conductive frame.

According to yet another exemplary embodiment, an arrangement is provided which comprises a substrate, an electrically conductive frame, a plurality of electronic chips, an encapsulant, and electrically conductive contacts, wherein the plurality of electronic chips are arranged in a plurality of chip accommodation cavities each defined by a respective surface portion of the substrate and a wall delimited by a respective one of a plurality of holes in the electrically conductive frame arranged on the substrate, wherein the electronic chips are at least partially encapsulated in the chip accommodation cavities by the encapsulant, and wherein the electrically conductive contacts are formed for electrically contacting the at least partially encapsulated electronic chips.

According to yet another exemplary embodiment, an electronic component is provided which comprises at least one electronic chip, an electrically conductive frame structure having at least one opening in which the at least one electronic chip is placed, an encapsulant encapsulating at least part of the at least one electronic chip and at least part of the electrically conductive frame structure, and electrically conductive contacts extending through the encapsulant for contacting a main surface of the at least one electronic chip and the electrically conductive frame structure.

An exemplary embodiment has the advantage that a batch-wise electric connection and encapsulation may be performed for a large number of electronic chips at the same time. Advantageously, this can be accomplished without the need to apply high temperature procedures (which may for instance occur in a conventional procedure of soldering electronic chips to an electrically conductive substrate such as a leadframe) which prevents the sensitive electronic chips from stress. In contrast to this, an exemplary embodiment embeds a plurality of electronic chips in a parallel process in holes or recesses formed in an electrically conductive frame. Together with such an electrically conductive frame an additional substrate may be used to which the chips and the frame may be attached and which may serve as a support base during the encapsulating. The substrate may also support the electronic chips mechanically and maintain the electronic chips at a desired position as well. Thus, the chip mounting procedure may be rendered very easy and may avoid high temperature and high stress conditions. In addition, the electrically conductive frame, which may contribute to the electric connection of the electronic chips to an electronic periphery, can be designed with a high degree of freedom. In particular, the properties of the electrically conductive frame may be selected to meet all requirements of a subsequent procedure of forming electric contacts of the electronic chips.

DESCRIPTION OF FURTHER EXEMPLARY EMBODIMENTS

In the following, further exemplary embodiments of the methods, the arrangement and the electronic component will be explained.

In an embodiment, each of the plurality of electronic chips is placed on the respective surface portion of the substrate before covering a further surface portion of the substrate with the electrically conductive frame to thereby accommodate the electronic chips in the holes of the electrically conductive frame. Thus, the placement of the electronic chips on the substrate may be performed before connecting the electrically conductive frame to the previously formed arrangement of substrate and electronic chips (for instance, the electronic chips may be adhered to an adhesive surface of the substrate). By such a procedure, a conventional soldering of electronic chips for connection to a ground can be substituted by a solder-free connection, thereby preventing high soldering temperatures which apply a high stress onto the electronic chips.

In an alternative embodiment, the electronic chips are first accommodated in the holes of the electrically conductive frame before placing the substrate on the electrically conductive frame and the electronic chips. In such an embodiment, the chips may first be placed in the recesses of the electrically conductive frame, and afterwards the substrate may be connected (for instance attached or even adhered) to both electronic chips as well as electrically conductive frame. Also this procedure is very gentle for the electronic chip and avoids high temperature procedures and procedures applying high mechanical stress on the electronic chips.

In an embodiment, the electrically conductive contacts are formed to electrically connect each of the electronic chips to a respective portion of the electrically conductive frame.

Such an electric intra-package coupling can for instance be achieved by vias formed in the encapsulation and filled with electrically conductive material such as a metal to connect the electronic chips with the electrically conductive frame. The filled vias may be connected to one another by an electrically conductive connection structure which may be deposited onto an exterior surface of the encapsulation.

In an embodiment, the electrically conductive contacts are formed on each of two opposing main surfaces of the electronic chips. Therefore, both the front side as well as the back side of the electronic chips may be electrically contacted. For example, in case that the electronic chips are power transistors, one of the main surfaces may contain a source connection and a gate connection, whereas the other main surface may comprise a drain connection. In view of the manufacturing procedure, an upper surface of the chips is easily accessible by forming access holes in the encapsulation, whereas a lower surface of the chips is easily accessible by either removing the substrate or forming access holes in the substrate.

In an embodiment, access holes are formed in the encapsulant, and the access holes are filled with electrically conductive material to thereby form at least part of the electrically conductive contacts for electrically contacting the electronic chips. For instance, the formation of the access holes may be performed by laser drilling or by lithography and etching. Filling the access holes may be performed by a suitable deposition procedure.

In an embodiment, the access holes formed in the encapsulant are filled with electrically conductive material to thereby electrically contact each of the electronic chips to a respective portion of the electrically conductive frame. By the described via formation and filling procedure in combination with a formation of a connection between different filled vias, the described electrical coupling may be accomplished with a basically U-shaped connection structure.

In an embodiment, dimensions of the electronic chips, the electrically conductive frame and the encapsulant are selected so that a depth of the access holes for contacting the electronic chips is substantially the same as a depth of the access holes for contacting the respective portions of the electrically conductive frame. Since there is large degree of freedom to select a thickness of the electrically conductive frame, such a procedure may ensure that the length of the vias for contacting the electrically conductive frame and the length of the vias for contacting an assigned electronic chip may be rendered identical or very similar, which overcomes significant technological problems conventionally occurring when such lengths are very different from one another.

In an embodiment, at least part of the electrically conductive contacts is formed by removing the substrate from the electronic chips after the encapsulating to thereby expose a main surface of each of the electronic chips, and by subsequently applying electrically conductive material on the exposed main surfaces of the electronic chips. For instance, the substrate may be a sheet which can be peeled off or delaminated from the remainder of the formed arrangement. By removing the substrate, one main surface of each electronic chip may be exposed so that it can be easily electrically connected by depositing corresponding material on the exposed surface.

In an embodiment, at least part of the electrically conductive contacts is formed by forming access holes in the substrate for exposing surface portions of the electronic chips, and filling the access holes in the substrate with electrically conductive material. Thus, as an alternative to removing the substrate, a main surface of the electronic chip may be exposed by forming access holes, for instance by laser drilling, etching, etc.

In an embodiment, an electrically conductive contact is formed in the encapsulant to thereby electrically contact the electrically conductive frame. Particularly an upper main surface of the electronic chips may be accessed by forming such access holes in the encapsulation, for instance by laser drilling, etching, etc.

In an embodiment, the plurality of electronic chips is provided with a thickness which is identical to a thickness of the electrically conductive frame. Such a geometry forms the basis for forming the vias for connection to the electronic chips and to the electrically conductive frame having the same length.

In an embodiment, at least a part of the electronic chips is configured as semiconductor power chips. For example, such a semiconductor power chip may be used for automotive applications. A semiconductor power chip may comprise one or more field effect transistors (such as MOSFETs), one or more bipolar transistors (such as IGBTs), one or more diodes, inverter circuits, half-bridges, etc.

In an embodiment, the electrically conductive frame is configured to form at least part of an electric connection between at least two of the electronic chips. In such an embodiment, a portion of the electrically conductive frame may be synergetically used for electrically bridging neighboured electronic chips.

In an embodiment, at least part of the semiconductor power chips is in electric contact with the electrically conductive frame. Hence, there may be an electrical contact between the chip and the electrically conductive frame. Moreover, the electrically conductive frame can also be used for redistribution in multichip package, e.g. between two different chips in the package.

In an embodiment, the substrate is removed from the electronic chips and the electrically conductive frame after the encapsulating. Thus, the substrate may be configured as a temporary substrate which does not form part of the finished product. Alternatively, the substrate main remain part of the finished product.

In an embodiment, an arrangement formed at least by the electrically conductive frame, the encapsulant and the electronic chips is singularized into a plurality of sections each comprising at least one of the electronic chips, at least a portion of the electrically conductive frame and at least a portion of the encapsulant. Each of these sections may be considered as a packaged chip which already comprises all necessary connections for connecting it to an electronic periphery.

In an embodiment, the singularizing is performed so that a separation between the various sections is performed without removing material of the electrically conductive frame. This can be achieved by forming the structure of the electrically conductive frame with recesses at later singularizing lines. Preventing the singularizing from being done at metallic portions eases the singularizing process.

In an embodiment, the singularizing is performed so that each section also comprises a portion of the substrate. Hence, each section or packaged chip may optionally comprise a portion of the substrate, when the substrate is a permanent substrate forming part of the finished product.

In an embodiment, the plurality of holes in the frame are through-holes. Although in specific embodiments, also blind holes may be used for defining chip accommodation cavities, the provision of openings is easier because it allows for a simple, direct electric access to the electronic chips for contacting purposes with less effort.

In an embodiment, the substrate comprises or consists of an electrically insulating material. Since the substrate does not contribute to the electric connections, it can be electrically insulating. If it remains as a part of the finished product, it may serve as an electric insulator then as well.

In an embodiment, the substrate comprises at least one adhesive main surface, in particular two opposing adhesive main surfaces, so that at least the electronic chips (and if desired also the frame) can be adhesively attached to the substrate. When the substrate has two adhesive surfaces, one of the adhesive surfaces may affix the electronic chips (and if desired also the frame), whereas the other adhesive surface may be fixed to a supporting ground. In another embodiment, the adhesive surface opposing the electronic chips may be omitted.

In an embodiment, the substrate is connected to the electronic chips by a solder-free connection (for instance a glue connection). This avoids high temperature procedures which may have a negative impact on the electronic chips in terms of the applied mechanical stress. A solder connection is no longer necessary with the connection architecture according to an exemplary embodiment, because the mechanical connection is supported by the substrate, whereas the electrical connection is supported by the electrically conductive frame.

In an embodiment, the electrically conductive frame comprises an electrically conductive sheet having a one-dimensional arrangement or a two-dimensional arrangement of holes. For example, the conductive frame may have a strip like appearance, wherein the holes may be aligned along a line. Alternatively, the electrically conductive frame may have a layer like appearance, wherein the holes may be aligned for instance along rows and columns, i.e. in a matrix like pattern. In case of a two-dimensional arrangement, also a circular arrangement of the holes is possible, for instance.

In an embodiment, the encapsulating comprises encapsulating at least part of the electrically conductive frame and filling gaps formed between the electronic chips and the electrically conductive frame in the chip accommodation cavities. For example, the encapsulation material may fill all gaps between substrate, electronic chips and electrically conductive frame.

In an embodiment, the electronic chips are formed with a (particularly very thick) contact pad on a surface to be attached to the substrate, wherein the contact pad can be formed with a thickness which is substantially identical to a thickness of the electrically conductive frame. In such an embodiment, in addition to the electrically conductive frame, other electrically conductive portions which may have the same thickness as the electrically conductive frame may be provided at a lower main surface of the electronic chip. In such an embodiment, an upper surface of the electrically conductive frame and of the contact pad may be in flush or at the same height level, wherein the electronic chips may then vertically extend beyond these electrically conductive portions.

Still referring to the previous embodiment, an electrically conductive layer may be formed on a main surface of a semiconductor wafer, and the semiconductor wafer may be singularized into the plurality of electronic chips, wherein a respective portion of the electrically conductive layer forms the contact pad of the respective electronic chip. Thus, the formation of the thick contact pads may be performed on wafer level.

In one embodiment, the electronic chips may be used as sensors or actuators in microelectromechanical systems (MEMS), for example as pressure sensors or acceleration sensors. In another embodiment, the electronic chips may be used as semiconductor chips for power applications for instance in the automotive field and may for instance have at least one integrated insulated-gate bipolar transistor (IGBT) and/or at least one integrated diode.

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

For the encapsulating, a plastic material or a ceramic material may be used, if desired in combination with filler particles, fibers or glass cloth.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.), or may make use of standard PCB plating processes.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 to FIG. 5 show different cross-sectional views of arrangements obtained during carrying out a method of processing electronic chips for producing electronic components according to an exemplary embodiment.

FIG. 6 illustrates electronic components produced according to an exemplary embodiment by applying the procedure of FIG. 1 to FIG. 5.

FIG. 7 shows a cross-sectional view of an arrangement obtained during carrying out a method of processing electronic chips for producing electronic components according to another exemplary embodiment.

FIG. 8 shows a cross-sectional view of an arrangement obtained during carrying out a method of processing electronic chips for producing electronic components according to still another exemplary embodiment.

FIG. 9 shows a cross-sectional view of an arrangement obtained during carrying out a method of processing electronic chips for producing electronic components according to yet another exemplary embodiment.

DETAILED DESCRIPTION

Figure 1:
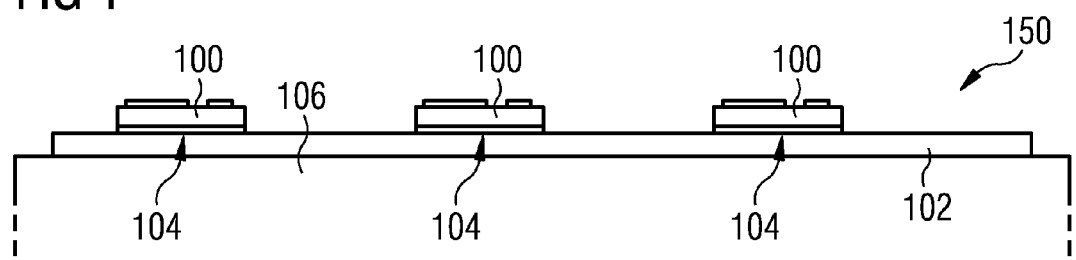

The illustration in the drawing is schematically and not to scale.

Before exemplary embodiments will be described in more detail referring to the figures, some general considerations will be summarized based on which exemplary embodiments have been developed.

Conventionally, electronic chips are electrically connected at their upper side to a copper substrate, a so-called leadframe, by soldering or by means of clips. As a result from the different values of the coefficient of thermal expansion of silicon and copper and as a result of a high temperatures during soldering, high mechanical stress is generated at the interface between electronic chip and leadframe. The high mechanical stress results in pronounced bending of the system constituted by electronic chip and leadframe. Furthermore, fractures in the silicon or in the solder may occur. In case of undesired thickness variances between leadframe and silicon, the mechanical stress translates towards the damaged chip edge, which may result in breakage after cooling down starting from the solder temperature.

In order to comply with these challenges, it is known to use a die attach of solder, adhesive material, nanopaste, etc., so that the electronic chip can be connected to the chip carrier mechanically stable and in many cases in an electrically conductive manner. This is however cumbersome and not sufficiently reliable.

In order to overcome these and other challenges, an exemplary embodiments proposes to omit the rigid solder connection between electronic chip and chip carrier, so that the drawbacks resulting from the die attach, in particular high connection temperatures of 150° C. and more, are avoided.

A gist of an exemplary embodiment is based on the concept of mounting an electronic chip without actual die attach, i.e. by firstly attaching electronic chips as active circuit carriers as well as an electrically conductive frame (such as a contact frame for redistribution) on a temporary substrate (such as a temporary adhesive foil or a dielectric encapsulation layer), and to form the electric contacts to the periphery only thereafter.

Such exemplary embodiments have the advantage that a die attach process, involving all the above-mentioned drawbacks, is dispensable. In particular, no elevated processing temperatures occur during mounting. In addition, no thermomechanical stress between electronic chip and chip carrier occurs. A method according to an exemplary embodiment includes only a small number of simple procedures. Parallel mounting of a plurality of chips in a batch process is possible. Moreover, the reliability of the manufactured electronic components is increased due to the small stress which acts on the electronic components during the mounting procedure. Furthermore, exemplary embodiments make it possible that thicker electronic chips are processible in comparison to a conventional process. One reason for this is that the length of the vias connecting the electronic chips and the vias connecting portions of the electrically conductive frame may be very similar or even identical. In other words, the metal sheet thickness of the electrically conductive frame may be used as a variable design parameter for a corresponding compensation. This is particularly important for logic dies which are usually significantly thicker, for instance having a thickness of 60 µm and more, than other die types.

Moreover, exemplary embodiments have the advantage that the heat removal properties can be significantly improved (in particular towards the upper side of the package or electronic component). A reason for this is that the electrically conductive material of the electrically conductive frame may be configured at the same time with a high thermal conductivity so that the heat conductivity of the package itself can be improved, in particular on the front side of the packaged electronic chips.

FIG. 1 to FIG. 5 show different cross-sectional views of arrangements 150, 200, 300, 400, 500 obtained during carrying out a method of processing electronic chips 100 and of finally producing electronic components 600 shown in FIG. 6 according to an exemplary embodiment.

Before carrying out the mounting procedure described in the following, the electronic chips 100 may be formed by conventional semiconductor technology on wafer level by processing a common semiconductor wafer which is later on singularized into the individual electronic chips 100. Each of the electronic chips 100 may have integrated circuit elements (such as field effect transistors) integrated therein.

In order to obtain the arrangement 150 shown in FIG. 1, many of such electronic chips 100 (for instance at least one hundred electronic chips 100), which in this case already comprise contacts pads (two at an upper main surface and one at a lower main surface), are temporarily attached with their lower main surfaces to an adhesive upper main surface of a sheet-like electrically insulating temporary substrate 102. More specifically, FIG. 1 shows that each of the electronic chips 100 has one contact pad on the lower side (for instance a drain contact, if the electronic chips 100 are transistor chips) and two contact pads on the upper side (for instance a source contact and a gate contact, if the electronic chips 100 are transistor chips). However, the electronic chips 100 may also be arranged upside down, i.e. in a flip chip arrangement, and/or may have other or additional contact pads than the ones shown in FIG. 1.

More precisely, the lower main surfaces of the electronic chips 100 are each mounted on a respective sticky or adhesive surface portion 104 of the substrate 102. As indicated schematically in FIG. 1, the lower main surface of the substrate 102, which may optionally also be adhesive, may be attached onto an optional temporary support structure 106 such as a solid plate (which may for instance be made of steel, nickel or any other metal, or of a plastic material such as FR4) for the purpose of providing a mechanical stabilization. The substrate 102 has a sticky surface and can be configured as a double sided adhesive tape. In a later stage, the substrate 102 may be removed or peeled off from the electronic chips 100.

The electronic chips 100 are mounted on the substrate 102 according to a defined pattern and in a defined distance from one other which corresponds to the dimensions of holes of an electrically conductive frame 200 which may also be denoted as a contact frame and which will be described in more detail referring to FIG. 2.

Figure 2:
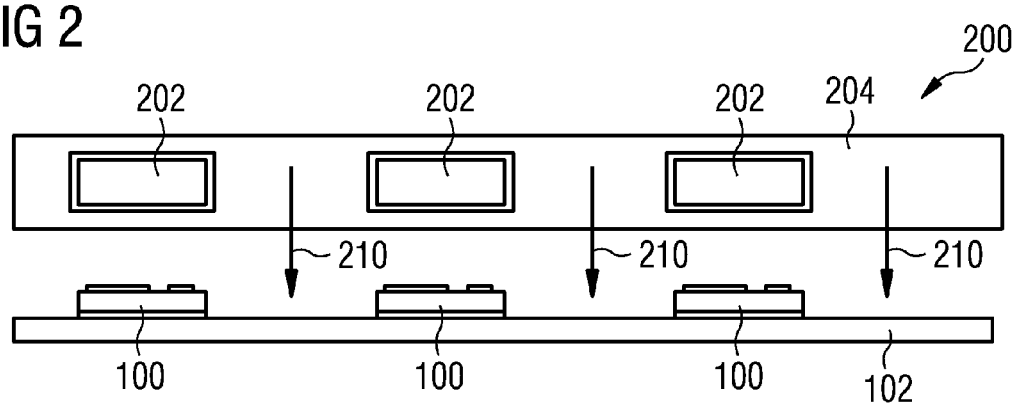

In order to obtain the arrangement 200 shown in FIG. 2, the electrically conductive frame 200 is placed on top of the arrangement 150 shown in FIG. 1, wherein temperature and pressure (as indicated schematically with arrows 210) may be applied in order to promote the robustness of the connection between the electrically conductive frame 204 and the arrangement 150. As can be taken from FIG. 2, the electrically conductive frame 204 has in this embodiment the appearance of a strip-like arrangement made of a metallic material and having a plurality of equidistant openings 202. The electrically conductive frame 204 may be configured as a metal contact foil with openings for the devices (embodied as the electronic chips 100) on the dielectric carrier foil (embodied as the electrically insulating substrate 102). The holes 202 may be formed by punching, etching, etc. Each of the through holes or openings 202 has a sufficient size to receive or accommodate a corresponding one of the electronic chips 100 with clearance so that small gaps remain between the electronic chips 100 and the walls of the electrically conductive frame 204. The electrically conductive frame 204 as metallic contact frame is also affixed to the substrate 102 constituted as adhesive carrier tape.

FIG. 2 shows the electronic chips 100 and the substrate 102 in a side view and shows the electrically conductive frame 204 in a bottom view before attaching the latter to the substrate 102.

Figure 3:
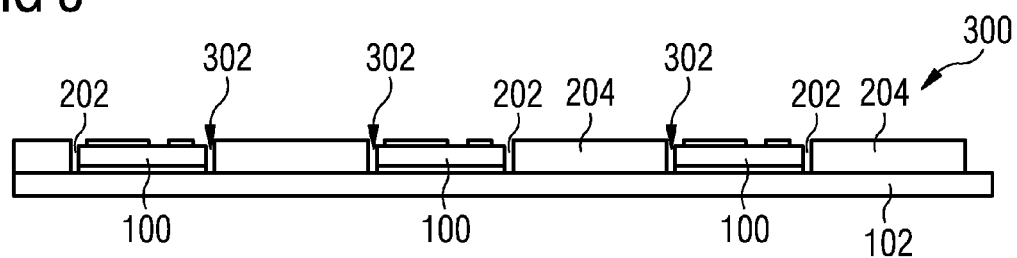

FIG. 3 shows the arrangement 300 in which the electronic chips 100 and the substrate 102 are visible in a side view and shows the electrically conductive frame 204 in a side view after having attached the latter to the substrate 102. By this attachment, chip accommodation cavities 302 are formed and are delimited by side walls of the electrically conductive frame 204 and by a corresponding top surface portion 104 (see FIG. 1) of the substrate 102. The sticky upper surface of the substrate 102 also preliminary fastens the electrically conductive frame 204 at the upper surface of the substrate 102.

In order to ensure proper matching of the positions of the electronic chips 100 on the substrate 102 and of the holes 202 within the electrically conductive frame 204 alignment facilities such as alignment marks may be arranged at the substrate 102 and/or at the electrically conductive frame 204 to render the mounting procedure even more precise. However, the required accuracy of the placement of the electronic chips 100 on the substrate 102 is not too strict, since it is sufficient that the electronic chips 100 are arranged within the chip accommodation cavities 302 with some clearance.

It should be said that, in other embodiments, the procedures according to FIG. 1 on the one hand and FIG. 2/FIG. 3 on the other hand may be carried out in the inverse order. Thus, it is also possible that the electronic chips 100 are firstly placed in the holes 202 of the electrically conductive frame 204 before both the electronic chips 100 and the electrically conductive frame 204 are, as a whole, attached to the sticky surface of the substrate 102.

In order to obtain the arrangement 400 shown in FIG. 4, an encapsulant 402 is formed on top of the arrangement 300 so as to fully embed the electronic chips 100 and the electrically conductive frame 204, while the substrate 102 serves as a support base. The encapsulating 402 may be formed by molding liquid material which is subsequently hardened in all the gaps between the mentioned components of the arrangement 400. Alternatively, the encapsulation 402 may be formed by lamination. In general, it is possible to form the encapsulant 402 by printing, dispensing, depositing, etc. The encapsulant 402 may be formed of plastic, epoxy, or polymeric material, with or without particles. The encapsulating material may be attached to the arrangement 300 as a liquid or as a solid, for instance as a sheet. The encapsulating material should properly adhere to the remaining components of the arrangement 400, and it should be made of a mechanically robust material to mechanically protect the constituents embedded therein. Moreover, it should be made of an electrically insulating material which surrounds and separates various electrically conductive structures described below in more detail. It is furthermore advantageous if the encapsulant 402 is made of a thermally conductive material so as to efficiently dissipate heat generated by the electronic chips 100 during operation of the corresponding electronic components 600.

In order to obtain the arrangement 500 shown in FIG. 5, access holes are formed in the encapsulation 302 up to a depth to contact the electronic chips 100 as well as the electrically conductive frame 204. The formation of the access holes can be performed by laser drilling, for example using a $CO_2$ laser, or by photolithography and etching. Later on, the formed access holes may be filled with an electrically conductive material such as copper, silver, aluminum or any other metal which can for instance be applied by a deposition procedure.

Preferably, the filling of the access holes can be performed by employing a galvanic procedure. For instance, it is first possible to form a metallic seed layer, for example by sputtering, chemical vapor deposition plasma enhanced chemical vapor deposition, or electroless Cu plating process or direct metallization process. It is then possible to thicken the formed seed layer, for example by electroplating.

As a result, top electric contacts 502 for externally connecting the electronic chips 100 are formed.

The arrangement 500 therefore shows redistributed and encapsulated semiconductor devices as the electronic chips 100 on the substrate 102 configured as a dielectric carrier foil. Highly advantageously, the depths of the filled access holes contacting the electronic chips 100 and contacting the electrically conductive frame 204 are the same. This is the result of the selection of the electrically conductive frame 204 with an appropriate thickness. By taking this measure, severe technological problems occurring when different vias have to be filled with different amount of material can be overcome.

In order to obtain the electronic components 600 shown in FIG. 6, the substrate 102 is removed from the rest of the arrangement 500 by peeling it off. By simply removing the substrate 102, the lower electrically conductive contact pads of the electronic chips 100 are exposed so that they can be directly used as electric contacts of the packaged electronic components 600. Additional electric contacts may be formed at the bottom surface thereof as well.

Then, the arrangement 500 is singularized into the plurality of electronic components 600 each of which being a readily packaged electronic chip arrangement. The singularizing procedure may be performed using laser processing, sawing and/or mechanical dicing.

For electronic power applications involving at least one power semiconductor chip as an electronic chip 100, it is important to have both main surfaces of the electronic chips 100 equipped with electric contacts. Therefore, the explained procedure is particularly appropriate for high power applications.

A comparison of FIG. 6 with FIG. 5 shows that the singularizing procedure also removes the material of the electrically conductive frame 204. This can be advantageously performed by etching.

FIG. 7 shows a cross-sectional view of an arrangement 700 obtained during carrying out a method of processing electronic chips 100 for producing electronic components 600 according to another exemplary embodiment.

According to this alternative embodiment, the processing starts as described above referring to FIG. 1 to FIG. 5. However, the substrate 102 is not removed in this embodiment but is made subject of an access hole formation procedure by which access holes protruding through the substrate 102 are formed which end at lower surfaces of the electronic chips 100 and the electrically conductive frame 204. In the embodiment shown in FIG. 7, the foil forming the support substrate 102, which for instance can also be made of a photolithographically patternable polymer material, remains as a dielectric back side layer in the housing, after having formed contact holes and after having filled the contact holes with electrically conductive material in particular by a galvanic procedure. As a result, bottom electric contacts 702 for externally connecting the electronic chips 100 and the electrically conductive frame 204 are formed.

Although not shown in the figures, the arrangement 700 shown in FIG. 7 can then be singularized into individual electronic components 600 each of which still having a portion of the substrate 102 in the finished product.

FIG. 8 shows a cross-sectional view of an arrangement 800 obtained during carrying out a method of processing electronic chips 100 for producing electronic components 600 according to still another exemplary embodiment. The embodiment of FIG. 8 differs from the embodiment of FIG. 7 in that the electrically conductive frame 204 is configured (in particular is patterned accordingly) in such a way that there is no electrically conductive material thereof located along the singularizing lines such as dicing lines. This has the advantage that it is dispensable to saw or etch through metallic material which is more difficult than etching through material of the encapsulant 302 and the substrate 102.

As can be taken from FIG. 1 to FIG. 8, in each of these embodiments an upper surface of the electronic chips 100 flushes with, is aligned with or is at the same height level as an upper surface of the electrically conductive frame 204. This has the technical advantage that the via formation is significantly simplified, because the vias all extend up to the same depth into the respective arrangements.

FIG. 9 shows a cross-sectional view of an arrangement 900 obtained during carrying out a method of processing electronic chips 100 for producing electronic components 600 according to yet another exemplary embodiment.

According to the embodiment of FIG. 9, the method comprises forming the electronic chips 100 with a contact pad 902 on a surface to be attached to the substrate 102, wherein the contact pad 902 is formed with a thickness which is substantially identical to a thickness of the electrically conductive frame 204.

For forming the contact pads 902 in a batch procedure, the method furthermore comprises forming an electrically conductive layer on a main surface of a semiconductor wafer (not shown), and singularizing the semiconductor wafer with its electrically conductive layer into the plurality of electronic chips 100, wherein a respective portion of the electrically conductive layer forms the contact pad 902 of the respective electronic chip 100.

In contrast to the embodiments of FIG. 1 to FIG. 8, the upper surface of the electronic chips 100 protrudes beyond an upper surface of the electrically conductive frame 204. However, in this embodiment, an upper surface of the contact pads 902 flushes with, is aligned with or is at the same height level as an upper surface of the electrically conductive frame 204. Hence, also in this embodiment, only one depth of the vias is necessary, i.e. those contacting the electrically conductive frame 204, wherein the electric contacts to an upper surface of the electronic chips 100 is performed at an upper surface of the encapsulation 402, i.e. without the need to form and fill vias. Therefore, the embodiment of FIG. 9 shows redistributed and encapsulated semiconductor devices with a wafer backside plate on a structured contact foil.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method, the method comprising:
    arranging a plurality of electronic chips in a plurality of chip accommodation cavities each defined by a respective surface portion of a substrate and a wall delimited by a respective one of a plurality of holes in an electrically conductive frame arranged on the substrate;
    at least partially encapsulating the electronic chips in the chip accommodation cavities by an encapsulant;
    forming electrically conductive contacts for electrically contacting the at least partially encapsulated electronic chips.

2. The method according to claim 1, wherein the method comprises placing each of the plurality of electronic chips on the respective surface portion of the substrate before attaching the electrically conductive frame onto a further surface portion of the substrate to thereby accommodate the electronic chips in the holes of the electrically conductive frame.

3. The method according to claim 1, wherein the method comprises accommodating the electronic chips in the holes of the electrically conductive frame before placing the substrate on the electrically conductive frame and the electronic chips.

4. The method according to claim 1, wherein the method comprises forming the electrically conductive contacts to contact each of the electronic chips to a respective portion of the electrically conductive frame.

5. The method according to claim 1, wherein the method comprises forming the electrically conductive contacts on each of two opposing main surfaces of the electronic chips.

6. The method according to claim 1, wherein the method comprises forming access holes in the encapsulant and filling the access holes with electrically conductive material to thereby form at least part of the electrically conductive contacts for electrically contacting the electronic chips.

7. The method according to claim 6, wherein the access holes formed in the encapsulant are filled with electrically conductive material to thereby electrically contact each of the electronic chips to a respective portion of the electrically conductive frame.

8. The method according to claim 1, wherein the method comprises forming at least part of the electrically conductive contacts by forming access holes in the substrate for exposing surface portions of the electronic chips, and filling the access holes in the substrate with electrically conductive material.

9. The method according to claim 1, wherein the method comprises providing the plurality of electronic chips with a thickness which is identical to a thickness of the electrically conductive frame.

10. The method according to claim 1, wherein the method comprises configuring at least a part of the electronic chips as semiconductor power chips.

11. The method according to claim 1, wherein the method comprises configuring the electrically conductive frame to form at least part of an electric connection between at least two of the electronic chips.

12. The method according to claim 1, wherein the method comprises removing the substrate from the electronic chips and the electrically conductive frame after the encapsulating.

13. The method according to claim 1, wherein the method comprises singularizing an arrangement formed at least by the electrically conductive frame, the encapsulant and the electronic chips into a plurality of sections each comprising at least one of the electronic chips, at least a portion of the electrically conductive frame and at least a portion of the encapsulant.

14. The method according to claim 1, wherein the substrate comprises or consists of an electrically insulating material.

15. The method according to claim 1, wherein the substrate comprises at least one adhesive main surface, in particular two opposing adhesive main surfaces, so that at least the electronic chips are adhesively attached to the substrate.

16. The method according to claim 1, wherein the method comprises connecting the substrate to the electronic chips by a solder-free connection.

17. The method according to claim 1, wherein the electrically conductive frame comprises an electrically conductive sheet having one of a one-dimensional arrangement and a two-dimensional arrangement of holes.

18. The method according to claim 1, wherein the method comprises forming the electronic chips with a contact pad on a surface to be attached to the substrate, wherein the contact pad is formed with a thickness which is substantially identical to a thickness of the electrically conductive frame.

19. The method according to claim 1, wherein the method comprises forming the encapsulant by at least one of the group consisting of molding, laminating, and applying a polymer-based material.

20. A method of forming electronic components, the method comprising:
arranging a plurality of semiconductor power chips in a plurality of chip accommodation cavities each defined by a respective surface portion of a substrate and a wall delimited by a respective one of a plurality of through-holes in an electrically conductive frame arranged on the substrate;
at least partially encapsulating the semiconductor power chips in the chip accommodation cavities and the electrically conductive frame by an encapsulant;
forming first electrically conductive vias in the encapsulant for electrically contacting a respective main surface of the semiconductor power chips;
forming second electrically conductive vias in the encapsulant for electrically contacting respective portions of the electrically conductive frame;
wherein at least one of the semiconductor power chips, at least part of the electrically conductive frame, at least part of the encapsulant, at least one of the first electrically conductive vias and at least one of the second electrically conductive vias form at least part of a respective one of the electronic components.

21. The method according to claim 20, wherein the first electrically conductive vias and the second electrically conductive vias are formed to extend up to substantially the same depth into the encapsulant.

22. The method according to claim 20, wherein at least part of the semiconductor power chips is in electric contact with the electrically conductive frame.

23. The method according to claim 20, wherein the method comprises placing each of the plurality of semiconductor power chips on the respective surface portion of the substrate before attaching the electrically conductive frame onto a further surface portion of the substrate to thereby accommodate the semiconductor power chips in the holes of the electrically conductive frame.

24. The method according to claim 20, wherein the method comprises forming electrically conductive back contacts through the substrate for contacting another main surface of the semiconductor power chips which other main surface opposes the main surface of the semiconductor power chips which is contacted by the first electrically conductive vias.

25. The method according to claim 20, wherein the method comprises removing the substrate from the semiconductor power chips and the electrically conductive frame after the encapsulating.

26. An arrangement, comprising:
a substrate;
an electrically conductive frame;
a plurality of electronic chips;
an encapsulant;
electrically conductive contacts;
wherein the plurality of electronic chips are arranged in a plurality of chip accommodation cavities each defined by a respective surface portion of the substrate and a wall delimited by a respective one of a plurality of holes in the electrically conductive frame arranged on the substrate;
wherein the electronic chips are at least partially encapsulated in the chip accommodation cavities by the encapsulant;
wherein the electrically conductive contacts are formed for electrically contacting the at least partially encapsulated electronic chips.

* * * * *